(12) United States Patent
Pei

(10) Patent No.: US 8,382,967 B2
(45) Date of Patent: Feb. 26, 2013

(54) MAGNETIC DEVICE AND MAGNETRON SPUTTERING DEVICE USING THE SAME

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 289 days.

(21) Appl. No.: 12/796,620

(22) Filed: Jun. 8, 2010

(65) Prior Publication Data

US 2011/0024290 A1 Feb. 3, 2011

(30) Foreign Application Priority Data

Jul. 30, 2009 (CN) .......................... 2009 1 0304993

(51) Int. Cl.
  C25B 9/00 (2006.01)
  C25B 11/00 (2006.01)
  C25B 13/00 (2006.01)
  C23C 14/00 (2006.01)
(52) U.S. Cl. ............ 204/298.2; 204/298.16; 204/298.17
(58) Field of Classification Search ............. 204/298.16, 204/298.17, 298.19, 298.2
See application file for complete search history.

(56) References Cited

U.S. PATENT DOCUMENTS

| | | | | |
|---|---|---|---|---|
| 5,855,744 A * | 1/1999 | Halsey et al. | ............ | 204/192.12 |
| 6,132,565 A * | 10/2000 | Lin | ............ | 204/192.15 |
| 6,783,638 B2 * | 8/2004 | Clarke | ............ | 204/192.12 |
| 7,513,982 B2 * | 4/2009 | Tepman | ............ | 204/298.2 |
| 7,785,449 B2 * | 8/2010 | Endo et al. | ............ | 204/192.12 |
| 8,088,263 B1 * | 1/2012 | Smith | ............ | 204/298.08 |
| 2007/0051617 A1 * | 3/2007 | White et al. | ............ | 204/192.1 |
| 2007/0151841 A1 * | 7/2007 | Inagawa et al. | ............ | 204/192.1 |

FOREIGN PATENT DOCUMENTS

| | | | |
|---|---|---|---|
| JP | S59-133370 | | 7/1984 |
| JP | 2000212739 A * | | 8/2000 |
| WO | WO 2009057715 A1 * | | 5/2009 |

* cited by examiner

*Primary Examiner* — Nicholas A Smith
*Assistant Examiner* — Michael Band
(74) *Attorney, Agent, or Firm* — Altis Law Group, Inc.

(57) ABSTRACT

A magnetron sputtering device includes a base arranged adjacent to a sputtering target, and a plurality of movable magnet assemblies. Each movable magnet assembly includes a support fixed to the base, and a plurality of magnets that are connected to each other, arranged on the support and comprising opposing poles facing the base. Each movable magnet assembly also includes a driving device to drive the plurality of magnets to slide with respect to the support.

9 Claims, 6 Drawing Sheets

MAGNETIC DEVICE AND MAGNETRON SPUTTERING DEVICE USING THE SAME

BACKGROUND

1. Technical Field

The present disclosure relates to magnetron sputtering devices and, more particularly, to a magnetron sputtering device having slidable magnet assemblies.

2. Description of Related Art

Magnetron sputtering is a known method to deposit a film on a workpiece. Generally, if, during sputtering, magnets generating a magnetic field are stationary, then continuous sputtering consumes a disproportionate amount of the sputtering target at that location quickly and generates hot spots at the locations of sputtering, which lowers the utilization rate of the sputtering target. Therefore, what is needed is a magnetron sputtering device to overcome the aforementioned problem.

BRIEF DESCRIPTION OF THE DRAWINGS

The components in the drawings are not necessarily drawn to scale, the emphasis instead being placed upon clearly illustrating the principles of the magnetron sputtering device. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
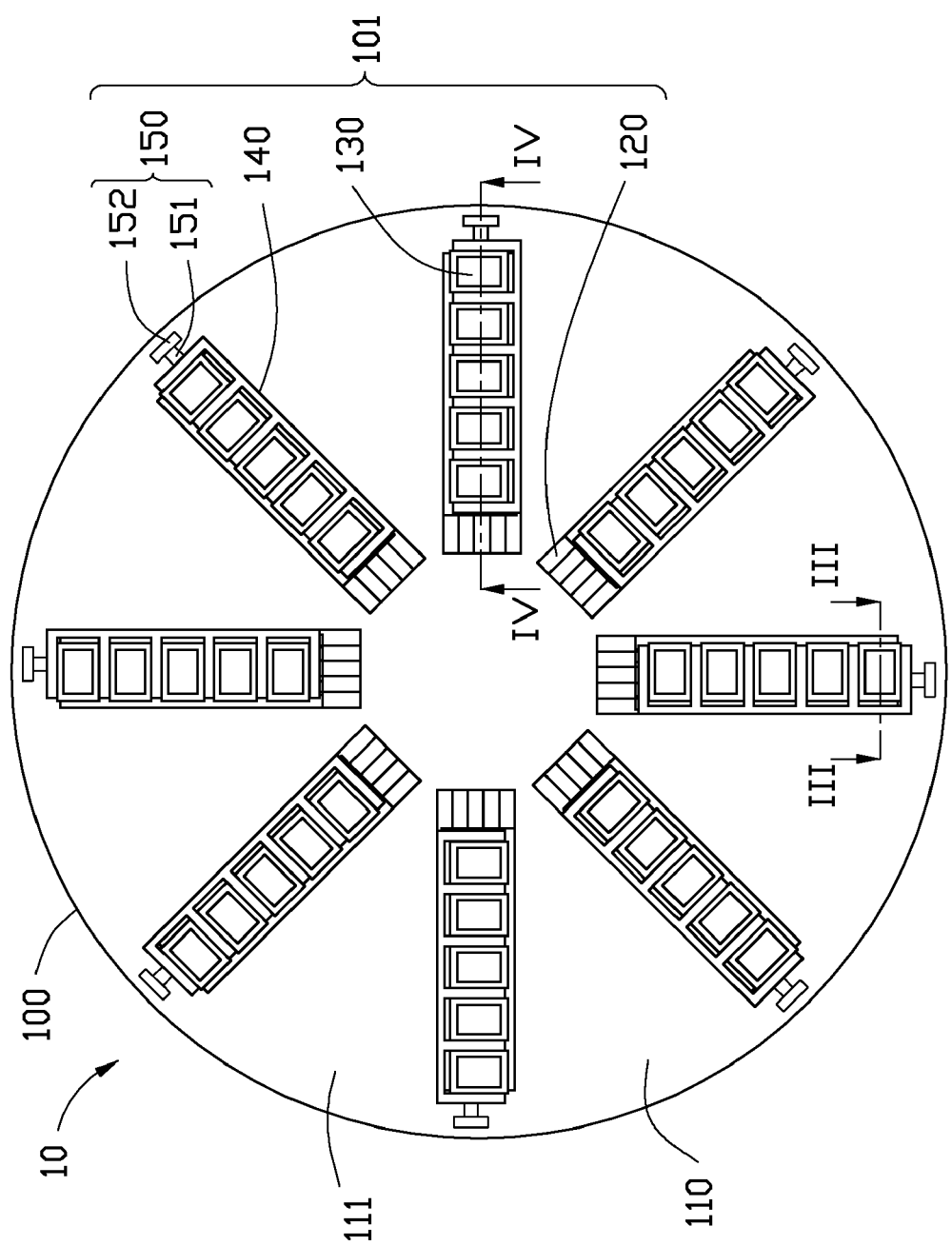
FIG. 1 is a schematic planar view of a magnetic device of a sputtering device in accordance with an exemplary embodiment.

Referring to FIG. 1, a magnetron sputtering device 10 including a magnetic device 100 is provided. The sputtering device 10 may also include other components (not shown), such as a housing defining a vacuum chamber to accommodate a sputtering target, which are well known to a person of ordinary skill in the art. For example, U.S. Pat. No. 6,413,382 to Wang et al. discloses such vacuum chamber and other components that may be helpful to understand the magnetron sputtering device 10.

Figure 4:
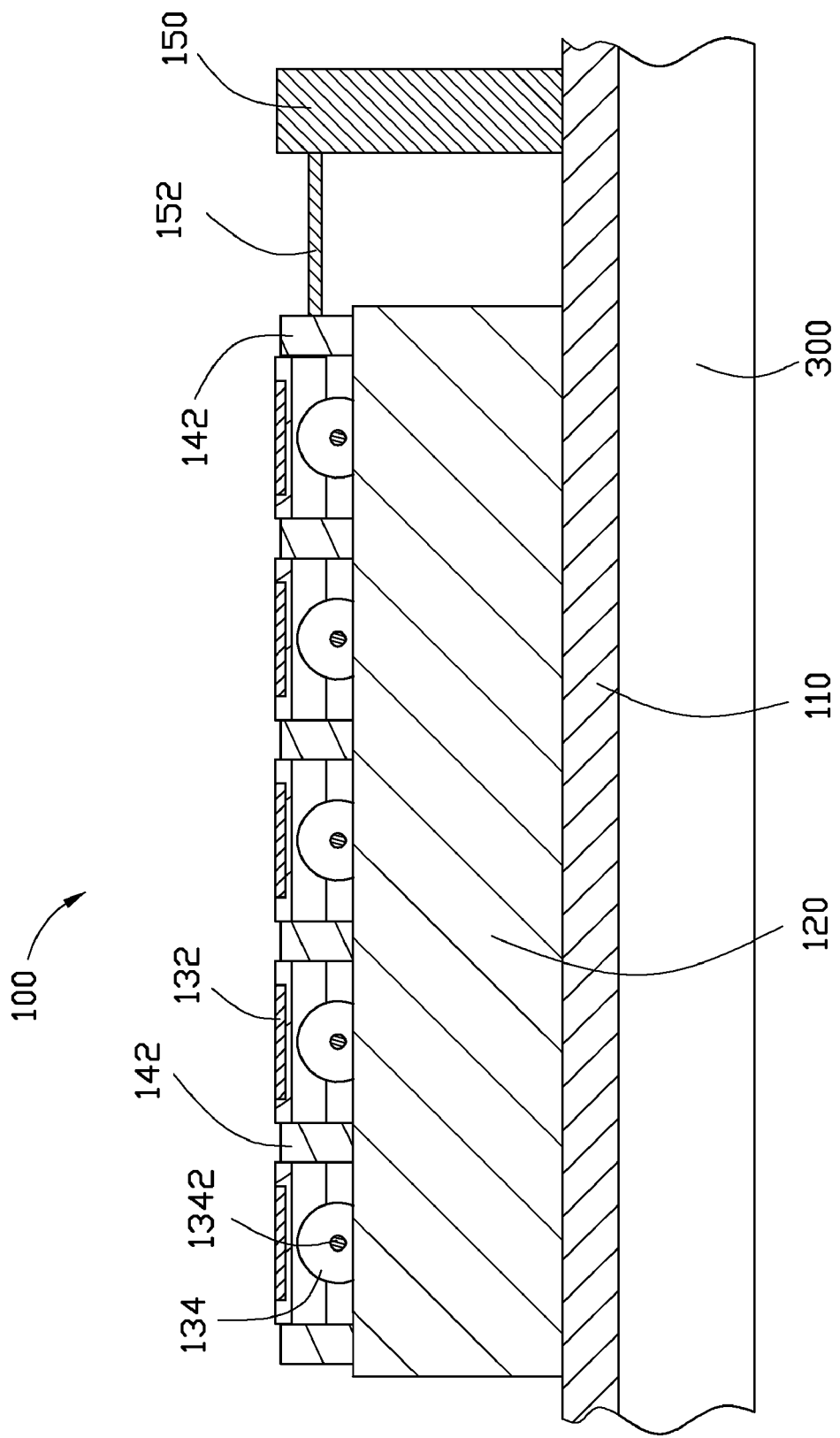
FIG. 4 is another schematic cross-sectional view of the magnetic device of FIG. 1, taken along line IV-IV of FIG. 1.

The magnetic device 100 includes a base 110 and a plurality of movable magnet assemblies 101 on the base 110. The base 110 may be arranged on the backside of a circular sputtering target 300 (FIG. 4). In the embodiment, the base 110 is substantially round to match the circular sputtering target 300, and includes a flat top surface 111. Each magnet assembly 101 includes a support 120, a plurality of magnetic members 130, a frame 140, and a driving device 150.

Figure 2:
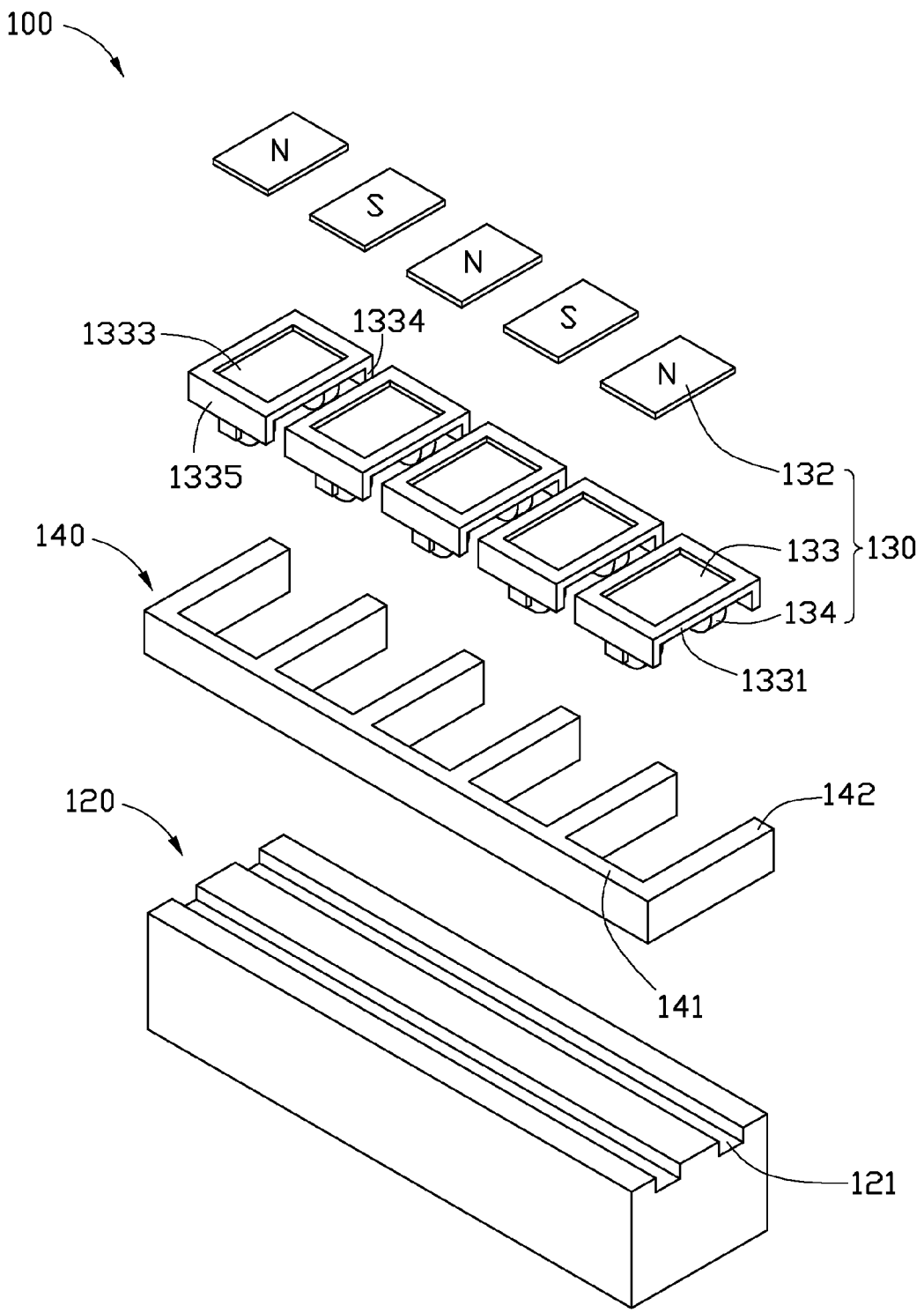
FIG. 2 is a schematic exploded view of the magnetic device of FIG. 1.

Referring to FIG. 2, the support 120 is fixed to the top surface 111 and defines two grooves 121. The grooves 121 extend along the lengthwise direction of the support 120 and are substantially parallel to each other. The magnetic members 130 are connected together by the frame 140. In the embodiment, the magnetic members 130 are arranged in a line and are equally spaced from each other. Each magnetic member 130 includes a magnet 132, a holder 133, and two wheels 134. The magnets 132 of the magnet assembly 101 are configured to have opposing poles facing the base 110. For example, if the north pole of one magnet 132 faces the base 110, the neighboring magnets 132 are then arranged to have south poles facing the base 110. As long as there are opposing poles facing the base 110, the magnets 132 may vary in arrangement and number according to need.

The holder 133 includes a top wall 1331 defining a recessed portion 1333 for receiving the magnet 132. The magnet 132 can be fixed to the holder 133 by any suitable known connection technique, such as gluing. The holder 133 also includes two sidewalls 1334 and 1335 at two sides of the top wall 1331. The frame 140 includes a main bar 141 and a plurality of connecting bars 142 formed on the same side of the main bar 141. The connecting bars 142 are substantially parallel to each other. Each holder 133 is fixed between two adjacent connecting bars 142.

Figure 3:
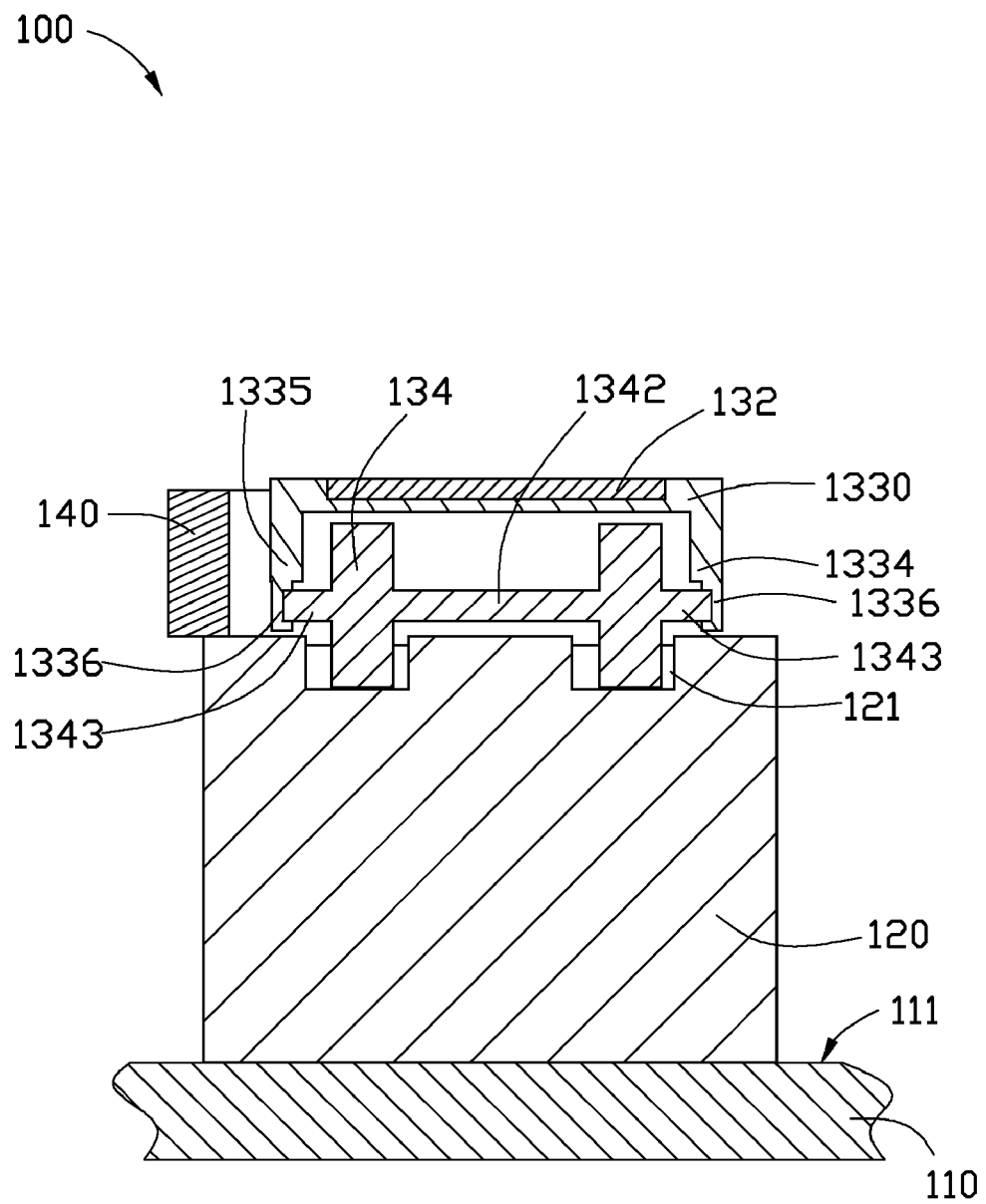
FIG. 3 is a schematic cross-sectional view of the magnetic device of FIG. 1, taken along line III-III of FIG. 1.

Referring to FIGS. 3 and 4, the two wheels 134 are received in and guided by the two grooves 121 of the support 120. The two wheels 134 are connected by an axle 1342. Two ends 1343 of the axle 1342 are rotatably received in axle holes 1336 formed in inner surfaces of the sidewalls 1334 and 1335, respectively. The magnets 132 can thus slide relative to the base 100 as the wheels 134 roll along the grooves 121.

In the embodiment, the driving device 150 can be a linear motor including a driveshaft 152 that can extend and retract in a direction substantially parallel to the base 110. One end of the driveshaft 152 is attached to a connecting bar 142 of the frame 140. The frame 140 can thus be driven to slide with respect to the base 110. The magnets 132 can then slide relative to the base 110 and provide movable magnetic fields above the sputtering target 300, allowing uniform utilization of the sputtering target 300. Film with uniform film thickness can thus be deposited on the workpiece (not shown).

Figure 5:
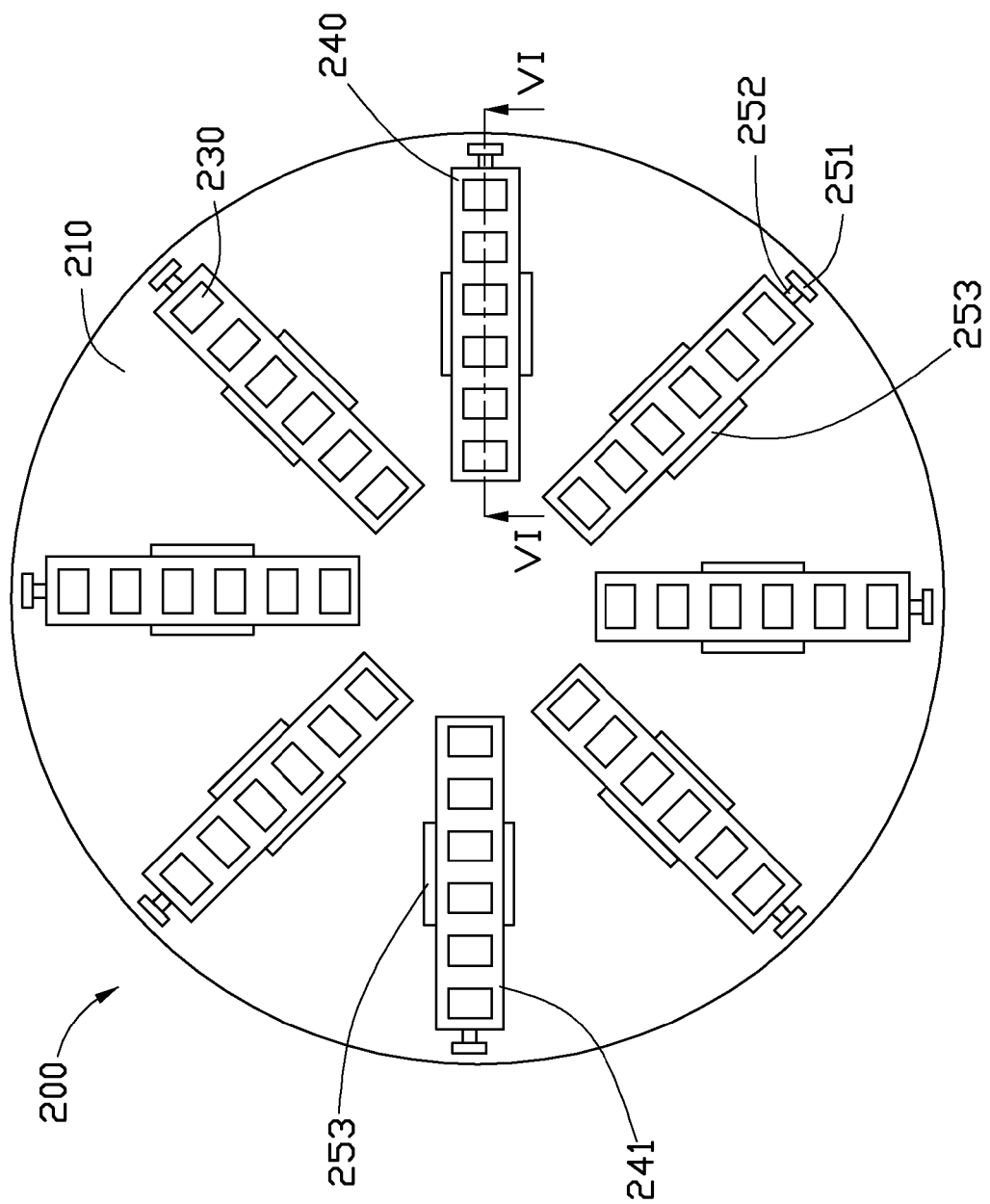
FIG. 5 is a schematic planar view of a magnetic device of a sputtering device in accordance with another exemplary embodiment.
Figure 6:
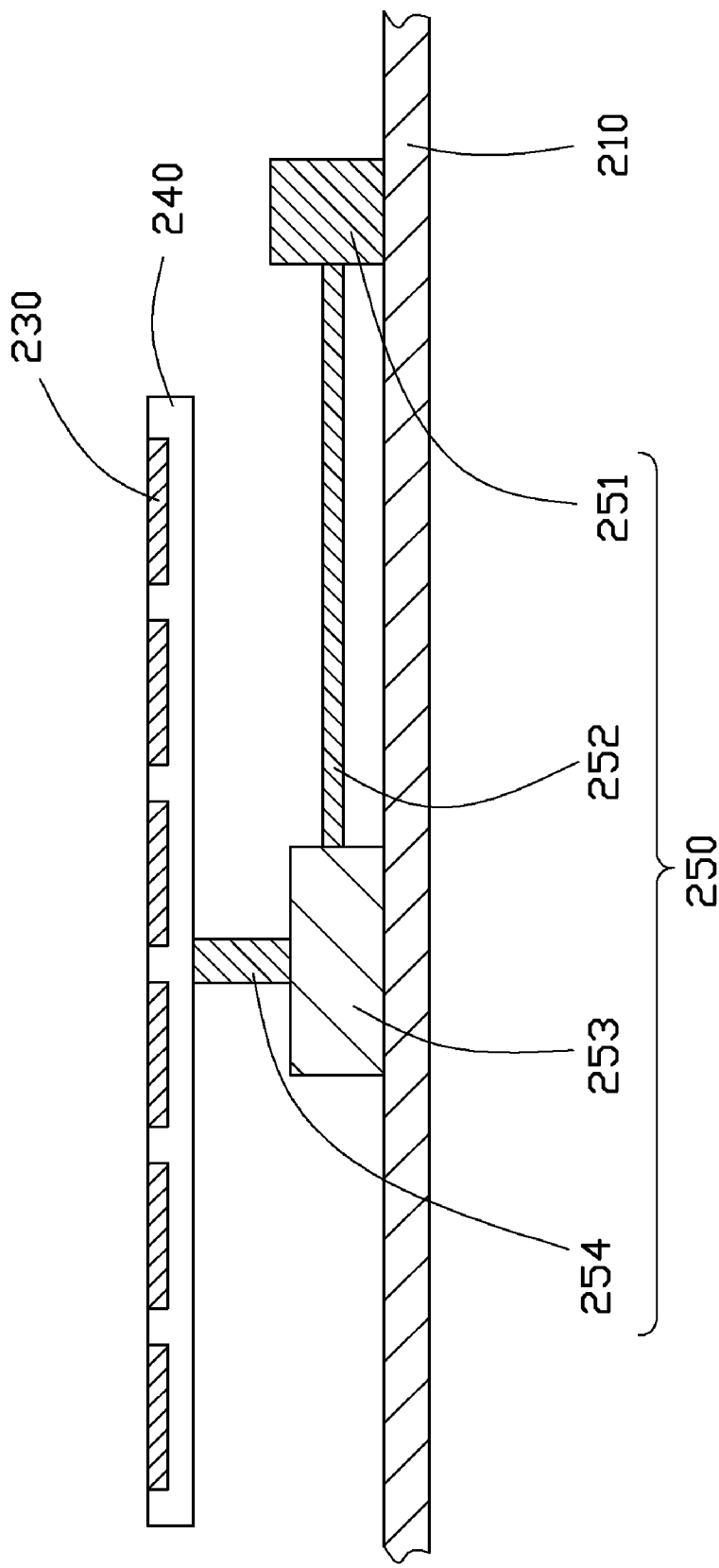
FIG. 6 is a schematic cross-sectional view of the magnetic device of FIG. 5, taken along line V-V of FIG. 5.

Referring to FIGS. 5 and 6, in an alternative embodiment, a magnetic device 200 is provided. Similar to the magnetic device 100, the magnetic device 200 includes a base 210, a plurality of magnets 230, a plurality of holders 240 for holding the magnets 230, and a driving device 250. The driving device 250 includes a first linear motor 251 having a first driveshaft 252, and a second linear motor 253 having a second driveshaft 254. The shaft 252 extends substantially parallel to the base 210. The shaft 254 is substantially perpendicular to the base 210. The motor 251 may be fixed to the base 210 and the motor 253 is slidably arranged on the base 210. The motor 253 may be fixed to one end of the motor 251. The holder 240 is fixed to one end of the shaft 254. The plurality of magnets 230 can thus be slid together with the motor 253 that is driven by the shaft 252. The plurality of magnets 230 can also be moved up and down with respect to the base 210 by the driving of the motor 253. Thus, movable magnetic fields are available to control during sputtering.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A magnetron sputtering device comprising:
a base mounted to a sputtering target; and
a plurality of movable magnet assemblies arranged on the base, the lengthwise directions of the movable magnet assemblies being respectively oriented along radial directions from a center of the base, the movable magnet assemblies each comprising:
    a support mounted to the base, two parallel grooves defined in the support;
    a plurality of magnets having alternating opposing poles facing the base;
    a frame;
    a plurality of holders fixed to the frame and configured for holding the plurality of magnets, each holder comprising two spaced sidewalls each defining an axle hole;
    two rotatable wheels mounted on each holders, the two grooves configured to receive and guide the two rotatable wheels, the two rotatable wheels connected together by a shaft, and opposite ends of the shaft being rotatably engaged in the axle holes of the sidewalls, respectively; and
    a driving device to drive the plurality of magnets to slide with respect to the support along the grooves.

2. The magnetron sputtering device according to claim 1, wherein the plurality of magnets in each of the plurality of movable magnet assemblies are arranged in a line.

3. The magnetron sputtering device according to claim 1, wherein the plurality of movable magnet assemblies are evenly spaced from each other.

4. The magnetron sputtering device according to claim 1, wherein the driving device comprises a linear motor to drive the plurality of magnets to slide.

5. A magnetic device for use in a magnetron sputtering device, comprising:
a base mounted to a sputtering target; and
a plurality of movable magnet assemblies arranged on the base, the lengthwise directions of the movable magnet assemblies being respectively oriented along radial directions from a center of the base, the movable magnet assemblies each comprising:
    a support fixed to the base, two parallel grooves defined in the support;
    a plurality of magnets having alternating opposing poles facing the base; and
    a frame;
    a plurality of holders fixed to the frame and configured for holding the plurality of magnets, each holder comprising two spaced sidewalls each defining an axle hole;
    two rotatable wheels mounted on each holders, the two grooves configured to receive and guide the two rotatable wheels, the two rotatable wheels connected together by a shaft, and opposite ends of the shaft being rotatable engaged in the axle holes of the sidewalls, respectively; and
    a driving device to drive the plurality of magnets to slide with respect to the support along the grooves.

6. The magnetic device according to claim 5, wherein the plurality of magnets in each of the plurality of movable magnet assemblies are arranged in a line.

7. The magnetic device according to claim 5, wherein the plurality of movable magnet assemblies are evenly spaced from each other.

8. The magnetic device according to claim 6, wherein the plurality of movable magnet assemblies are evenly spaced from each other.

9. The magnetron sputtering device according to claim 2, wherein the plurality of movable magnet assemblies are evenly spaced from each other.

* * * * *